United States Patent [19]

Remy

[11] Patent Number: 4,673,891

[45] Date of Patent: Jun. 16, 1987

[54] FREQUENCY SYNTHESIZER HAVING FIRST PHASE LOCKED LOOP FREQUENCY MULTIPLIED BY NEAR UNITY IN SECOND PHASE LOCKED LOOP

[75] Inventor: Joël Remy, Paris, France

[73] Assignee: Adret Electronique, Trappes, France

[21] Appl. No.: 787,191

[22] Filed: Oct. 15, 1985

[51] Int. Cl.$^4$ .......................... H03L 7/18; H03L 7/22

[52] U.S. Cl. ........................................ 331/2; 331/22; 331/25; 331/31

[58] Field of Search .................... 331/2, 22, 25, 31

[56] References Cited

U.S. PATENT DOCUMENTS 4,225,829  9/1980  Kumagai ............................. 331/2 X 4,458,329  7/1984  Remy ................................. 331/2 X

*Primary Examiner*—Siegfried H. Grimm
*Attorney, Agent, or Firm*—William A. Drucker

[57] ABSTRACT

A Frequency synthesis stage comprises two phase locked loops. The first ($O_1$, $D_1$, M, $CP_1$, $D_2$) divides the frequency $Fo + \Delta$ derived from preceding stages by N/Q, N being a variable integer, and adds to the result a standard frequency P which is in a fixed ratio with a value representative of large frequency steps so as to give an intermediate frequency $F_A$, while the second ($O_2$, $M_0$, $M_1$, $CP_2$, $D_3$) multiplies $F_A$ by NQ/r. P and Q are selected so that the product PQ is approximately equal to the mean of the limit values desired for the output frequency.

7 Claims, 2 Drawing Figures

FREQUENCY SYNTHESIZER HAVING FIRST PHASE LOCKED LOOP FREQUENCY MULTIPLIED BY NEAR UNITY IN SECOND PHASE LOCKED LOOP

BACKGROUND OF THE INVENTION

1. Field of the Invention

The invention concerns a frequency synthesizer stage designed to generate very high frequencies by adding high frequency steps to a frequency, derived, for example, from preceding stages of a synthesizer and itself comprising smaller frequency steps.

2. Description of the Prior Art

The process is already known, from French Pat. No. 73 17650 filed by the Applicant on the 16th May 1973 for "A variable frequency electric signals generator suitable for operating in a wide range", for realizing such a frequency summation by means of two voltage controlled oscillators each controlled by a phase locked loop, the first loop dividing the frequency $F_o+\Delta$ derived from preceding stages ($\Delta$ being the sum of the low steps) by a variable integer N by means of a programmable divider and adding to it a standard frequency P which represents the high step, while the second loop multiplies the intermediate frequency $F_A$ supplied by the first loop by the same factor N so as to give an output frequency $F_S = F_o + \Delta + NP$.

The drawback of this mode of generating of large steps is that the frequency $F_A$ and, consequently, the phase noise which affects the output frequency, are multiplied by a factor N which is all the larger because the number of frequency steps required is higher.

According to U.S. Pat. No. 4,458,329 filed by the Applicant on 2nd Dec. 1981 for a Frequency synthesizer including a fractional multiplier, the dividing factor N is replaced by a factor $NR+M$, R and M being integers, and the multiplication factor N by a factor R times smaller than $N+M/R$. The phase noise which affects $F_S$ is thus reduced in a ratio R without the number of large frequency steps being reduced.

However, this process is limited in practice to the synthesis of 40 or 50 large steps with a degradation of spectral purity in the order of 20 dB, corresponding to $R = 4$ or 5.

OBJECT OF THE INVENTION

The invention seeks to go beyond this limitation and obtain a multiplication factor of the phase noise by means of the second loop close to unity while covering a large range of output frequencies with a very large number of large frequency steps.

SUMMARY OF THE INVENTION

According to the invention, the first loop is adjusted so as to divide the input frequency ($F_o + \Delta$) by a first rational factor N having a number of values programmable according to the number of large steps desired, and in order to compare the result of this division with a beat between the quotient, by a second rational factor Q, of the intermediate frequency $F_A$ generated by the first loop and a standard frequency P, while the second loop is adjusted so as to multiply the intermediate frequency $F_A$ by a third rational factor which is in a simple ratio with the first rational factor N, the first two rational factors and the standard frequency being selected in order that the intermediate frequency $F_A$ is situated in the variation frequency band desired for the output frequency $F_S$.

According to a first feature of the invention, the first rational factor N is selected so that the ratio $F_S/F_A$ remains roughly within the range of unity within the variation limits of $\Delta$ and N and the product PQ is selected so as to be of the same order of magnitude as the arithmetical mean of the limit values desired for $F_S$.

According to a second feature of the invention, the second loop includes a mixer performing the beat between the frequencies $F_A$ and $F_S$, a first further mixer performing the beat between the frequency coming from the mixer and a harmonic of the quotient of $F_A$ by a first fixed ratio, a second further mixer performing the beat between the frequency issuing from the first further mixer and a harmonic of the quotient of $F_A$ by a second fixed ratio, and so on, the last mixer being a phase comparator and supplying a control voltage or current to the oscillator of the second loop.

BRIEF DESCRIPTION OF THE DRAWING

The invention will be better understood from the description which follows.

In the annexed drawing:

FIG. 1 is a block diagram of a synthesizer stage according to the invention, of which

DESCRIPTION OF THE PREFERRED EMBODIMENT

Figure 1:
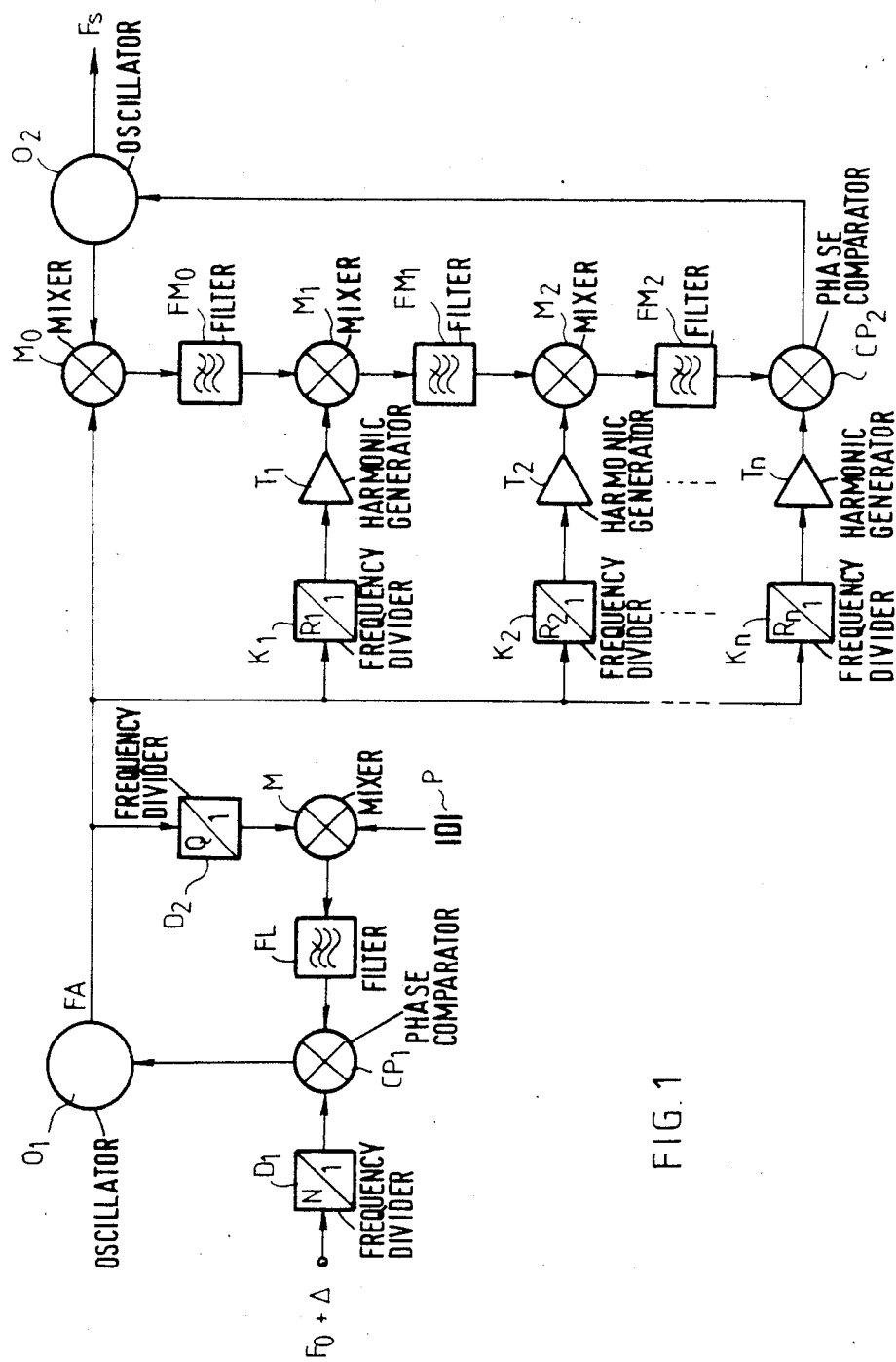

On FIG. 1, a first phase locked loop is represented comprising a voltage or current controlled oscillator $O_1$ whose frequency control input is connected to the output of a phase comparator $CP_1$. The latter receives on one input the frequency $(F_o + \Delta)/N$ obtained in a divider $D_1$ having a programmable division factor N and, on its other input, a beat derived from a mixer M, after filtering through a bandpass filter FL which only transmits the difference of the frequencies applied to M. These frequencies are constituted by a standard frequency P and by $F_A/Q$, $F_A$ being the output frequency of the oscillator $O_1$ and Q the division ratio of a fixed divider $D_2$.

In the steady-state, the following can be written:

$$(F_o+\Delta)/N = |F_A/Q - P|,$$

in which:

$$F_A = Q[P \pm (F_o+\Delta)/N] \qquad (1)$$

A second phase locked loop comprises a voltage or current controlled oscillator $O_2$, whose frequency control input is connected to the output of a sampling phase comparator $CP_2$. The latter receives on one input a harmonic, supplied by a harmonic generator $T_n$, of the frequency $F_A/R_n$ obtained at the output of a divider $K_n$ of fixed ratio $R_n$ and, on its other input, the beat obtained in a mixer $M_2$, after filtering by a bandpass filter $FM_2$ which only transmits the subtractive beat. $M_2$ receives firstly a harmonic, supplied by a generator $T_2$, of a frequency $F_A/R_2$ obtained at the output of a divider $K_2$ of fixed ratio $R_2$, and secondly the beat obtained in a mixer $M_1$ after filtering by a bandpass filter $FM_1$ which only transmits the subtractive beat. Finally, $M_1$ receives firstly a harmonic, supplied by a generator $T_1$, of a frequency $F_A/R_1$ obtained at the output of a divider $K_1$ of fixed ratio $R_1$, and secondly the beat obtained in a mixer $M_O$ which receives $F_A$ and the output frequency $F_S$ of $O_2$ after filtering by a filter $FM_0$. It ought to be emphasized here that the second loop just described includes n divider devices and mixers such as $(K_1-T_1-M_1)$, $(K_2-T_2-M_2)$ up to the last $(K_n-T_n-CP_2)$, n being an integer equal to 1, 2 or, preferably, 3 or more.

In the steady-state of the second loop, the following can be written:

$S_0(F_S-F_A)-S_1t_1F_A/R_1-S_2t_2F_A/R_2- \cdots -S_{n-1}t_{n-1}F_A/R_{n-1}=S_nt_nF_A/R_n$ $t_1, t_2 \ldots t_{n-1}, t_n$ being the ranks of the harmonic applied to $M_1, M_2 \ldots M_{n-1}, M_n$ and $S_0, S_1 \ldots S_{n-1}, S_n$ being coefficients equal to $\pm 1$ and which depend on that of the two frequencies applied to $M_0, M_1, M_2 \ldots M_{n-1}$ and $CP_2$ which is the highest.

Thus:

$S_0F_S=F_A[S_0+\Sigma_1^n(Si\ ti/Ri)]$ or even $F_S=F_A[1+\Sigma_1^n(S'i\ ti/Ri)]$ with $S'i=Si/S_0=\pm 1$ R being the smallest common multiple of the integers $R_1, R_2 \ldots R_{n-1}, R_n$. Any $Ri$ of them can be written:

$Ri=R/Zi$, $Zi$ being an integer

Therefore:

$$F_S = F_A\left(1 + \frac{\Sigma_1^n S'i\ ti\ Zi}{R}\right)$$

or, if one makes $N'=R+\Sigma_1^n S'i\ Zi\ ti$:

$$F_S=F_A N'/R \quad (2)$$

From equations (1) and (2), one obtains:

$F_S=N'QP/R\pm(Fo+\Delta).N'Q/RN$

All that remains is to select the numbers $Ri$ and Q so that $N'=K_1N$, $K_1$ being a rational number, in order that $F_S=K_1Q[NP/R\pm(Fo+\Delta)/R]=K_1Q/R.[N.P \pm Fo+\Delta]$ If one now regards as data the variation limits of $F_S$, the number of large frequency steps and the input frequency $Fo+\Delta$, the device of FIG. 1 first effecting a division by N, N shall obviously take as many values as one desires to obtain of large steps and, in addition, in practice a central value of N is imposed which is close to $R/K_1$. Indeed, with this constraint, $F_A$ remains in the order of magnitude of $F_S$.

Q may be any rational number whatsoever, including 1 (the divider $D_2$ being replaced by a more complex circuit if Q is fractional), but the second constraint is imposed in which PQ is close to the central value of $F_S$, or at the very least is situated inside the variation frequency band of $F_S$, which is an item of data. The choice of the factor Q thus depends on the value of the standard P selected.

The output frequency, according to the formula given above, varies by step of $$\frac{P \cdot Q \cdot K_1}{R}$$

and this step is an item of data. Thus $$\frac{K_1 Q}{R} = \frac{Q(1 + \Sigma Si\ ti/Ri)}{N}$$

shall be a given value constant in keeping with the step, standard frequency and the factor Q, which imposes a third constraint on $\Sigma_1^n Si\ ti/Ri$, thus on the ranks of harmonics and division ratios of samplers of the second loop.

The above three constraints having been respected, the ratio $F_S/F_A$ shall then be close to unity. Indeed, this ratio is $N'/R=1+\Sigma_1^n Si\ ti/Ri$ and $\Sigma_1^n Si\ ti/Ri$ is of necessity small.

In such circumstances, the noise generated by the first loop will only be multiplied by the second loop by a small factor.

Figure 2:
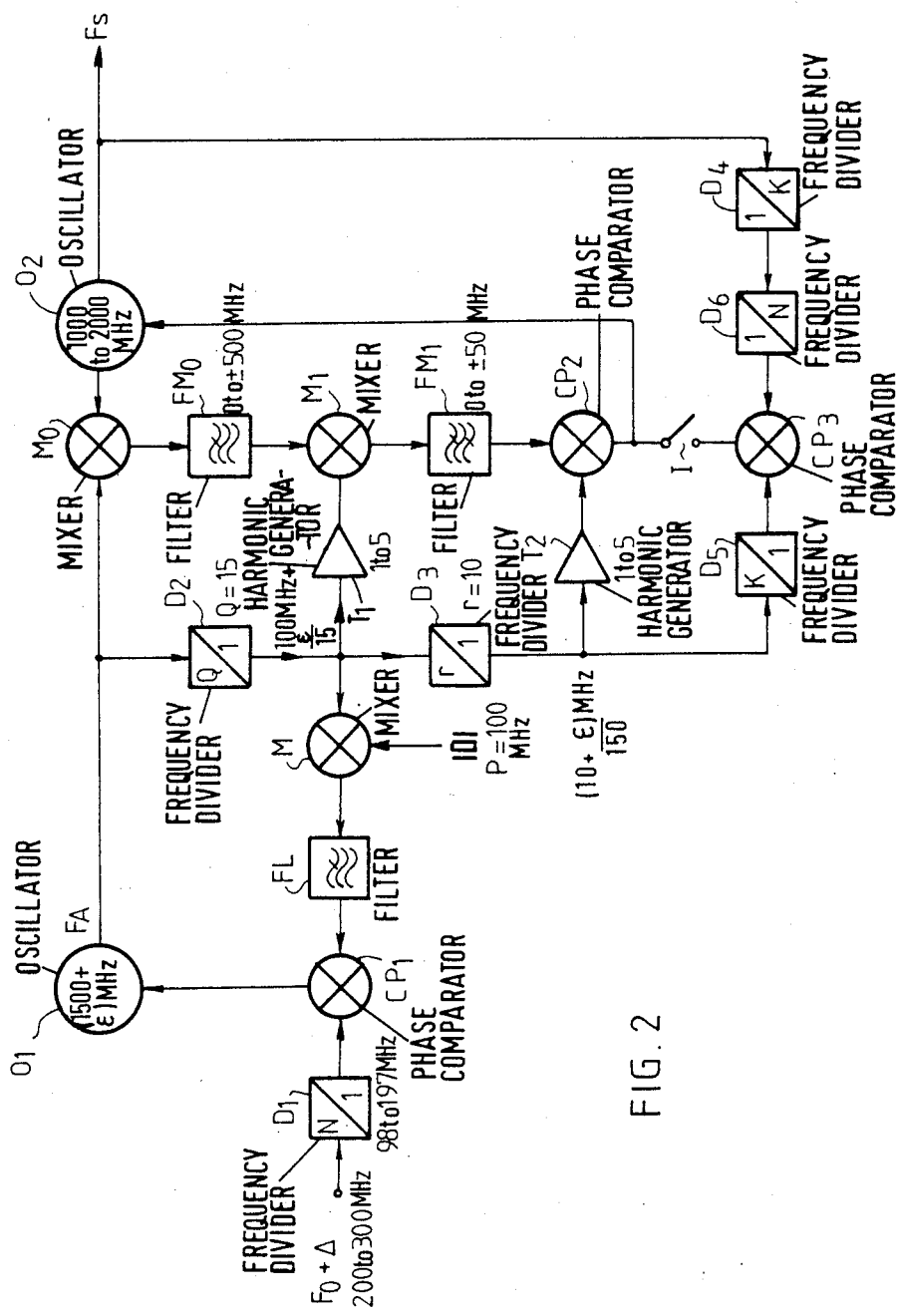
FIG. 2 represents a preferred embodiment.

To facilitate the full explanation of the properties of the device of FIG. 1, a preferred embodiment of this is given by FIG. 2.

By way of example, the output frequency $F_S$ whichis generated by the devide shown in FIG. 2 varies between 1000 and 2000 MHz and the input frequency, originating, for example, from preceding stages of a synthesizer, includes a fixed value Fo equal to 200 MHz and an increment $\Delta$ varying between 0 and 100 MHz by small steps, this expression referring to frequency steps as small as one requires, and which depend on the preceding stages.

The first loop is identical to that of FIG. 1, with $Q=15$, $P=100$ MHz and the integer N varying between 98 and 197.

The second loop includes two divider-mixer devices $(D_2T_1M_1)$ and $(D_2-D_3T_2CP_2)$, i.e. it is of the same type as that in FIG. 1, inscribing:

$R_1=Q$ and $R_2=Qr$, r being the fixed division ratio of $D_3$.

In the example in question, $r=10$, the filter $FM_0$ transmits the frequencies 0 to 500 MHz and the filter $FM_1$ the frequencies 0 to 50 MHz.

The device of FIG. 2 also includes a frequency approach loop $O_2D_4D_6-CP_3D_5 \ldots$ The frequency control input of $O_2$ is connected firstly to the output of $CP_2$ and secondly, through a circuit breaker I, to the output of a phase comparator $CP_3$, one input of which receives the frequency $F_S$ after division by an integer K in a fixed divider $D_4$ and by N (varying between 98 and 197) in a programmable divider $D_6$. The other input of $CP_3$ receives the output frequency of $D_3$, after division by K in a fixed divider $D_5$.

The phase control loop $D_4-D_6-CP_3-D_5$ is put into service on energizing the device and with each change of the number N of the large steps, the circuit breaker I being closed at the time.

When this is the case, the frequency of $O_2$ is controlled in such a way that the frequencies applied at $CP_3$ become identical, i.e. $F_A/QrK=F_S/NK$, in which $$F_S=F_A N/Qr. \quad (3)$$

By replacing $F_A$ by its value drawn from the equation (1) in (3), it becomes: (it being understood that with the values given in this example, it is the sign + which should be inscribed in the preceding formula (1))

$F_S=(Fo+\Delta+NP)/r$

In the example in question, $$F_S = \frac{200 \text{ to } 300 \text{ MHz}}{10} + (98 \text{ to } 197) \cdot 10 \text{ MHz},$$

which gives the frequency desired varying between 1000 and 2000 MHz.

The spectral purity of $F_S$ which would be obtained with this frequency approach loop is insufficient. Indeed, in order to allow for the practical realization of the divider $D_6$, which could, for example, operate at 200 MHz, K will be $=10$ at least with the result that the frequency multiplication ratio KN introduced by the loop will be between 980 and 1970.

A loss results from this of at least 60 dB as regards the signal/noise ratio, which is unacceptable as regards standard operational capacity.

This is why, as soon as the frequency approach is terminated, the circuit breaker I is opened (by known means not represented) and it is thus $CP_2$ which performs automatic control of $O_2$. The equalization of the frequencies which drive $CP_2$ gives:

$$S_0(F_S - F_A) - S_1 T_1 F_A/Q = S_2 T_2 F_A/Qr$$

with $S_0 = \pm 1$ according to the sign of the beat filtered through $FM_0$
$S_1 = \pm 1$ according to the sign of the beat filtered through $FM_1$ and
$S_2 = \pm 1$ according to the relative magnitudes of the frequencies applied to $CP_2$.

The following is deduced from this:

$$F_S = F_A \left(1 + \frac{S_1 T_1}{S_0 Q} + \frac{S_2 T_2}{S_0 Qr}\right) \quad (4)$$

or even, with $S'_1 = \frac{S_1}{S_0}$ and $S'_2 = \frac{S_2}{S_0}$ $$F_S = F_A \frac{Qr + S'_1 T_1 r + S'_2 T_2 r}{Qr}$$

If equations (4) and (3) are compared, one can deduce from them that, in order that the final frequency imposed by the control loop in established service is the same as the approach frequency, it is essential that:

$$Qr + S'_1 T_1 r + S'_2 T_2 = N$$

or, as regards the selected realization example:

$$N = 150 + 10 S'_1 T_1 S'_2 T_2$$

To establish the concepts, a special value of the frequency $F_o + \Delta$ shall be considered, i.e. $F_o + \Delta = 210$ MHz, and a special value of N, i.e. $N = 171$.
Thus, we have:

$$F_A = 15 \left(\frac{210}{171} + 100\right) = 1518.421053 \text{ MHz}$$

$$F_S = 1518.421053 \text{ MHz} \times \frac{171}{150} = 1731 \text{ MHz}$$

One thus obtains in $FM_0$ the beat $$F_S - F_A = 212.578948 \text{ MHz}.$$

The output frequency of $D_2$ is: $F_A/Q = 101.22807$ MHz, the second harmonic of which is 202.456140 MHz ($T_1 = 2$).
The beat in $M_1$ gives:

$$212.578948 - 202.456140 \neq 10.122807 \text{ MHz}.$$

The output frequency of $D_3$ is: $F_A/Qr = 10.122807$.
One thus has, for $T_2 = 1$, a nil beat in $CP_2$.

In the special case where $N = Qr$, namely 150 in the example in question, $F_A = F_S = 1520$ to 1530 MHz.

The beats at the output of $M_0$ and $M_1$ are therefore nil. The corresponding direct current components are transmitted by $FM_0$ and $FM_1$.

It will be observed that, if N differs from Qr by one, the difference between $F_S$ and $F_A$ is equal to $F_A/Qr$.

Now, $F_A$ is equal to $1500 \text{ MHz} + \Sigma$, with $\Sigma$ varying between $$\frac{15(200 \text{ to } 300 \text{ MHz})}{98 \text{ to } 197},$$

namely between 15.225 MHz and 45.915 MHz and consequently $F_A/Qr$ is very close to 10 MHz. This minimum difference between $F_A$ and $F_S$ is easy to filter into $FM_0$.

We are now going to move on to a more in-depth analysis of the operation of the device when the main loop is in service in order to demonstrate the interest as far as the spectral purity obtained is concerned.

Ba is the noise which affects the signal $Fo + \Delta$, BP the noise which affects the standard frequency P, $BF_A$ the noise of the oscillator $O_1$ in the first control loop and $BF_S$ the noise which affects the output signal of the device.

From the equation (1), it can be deduced that $$BF_A = Q \sqrt{\left(\frac{Ba}{N}\right)^2 + Bp^2}$$

by making the quadratic sum of the noises on the terms $$\frac{Fo + \Delta}{N}$$

and P and by multiplying this sum by Q).

It is known that the phase noise of a phase locked oscillator, defined in a 1 Hz wide band, is all the weaker because the necessary control band is itself narrower and the width of this control band is all the smaller because the oscillator has a narrower noise spectrum. Now, for technological reasons, such a narrow spectrum can only be obtained in practice if the $\Delta F/F$ imposed on the oscillator is small.

From this, it is clear that the frequency $F_A$ only varies by about 30 MHz which represents about 5% of the value of $F_A$. For such a small $\Delta F/F$, the controlled oscillator will fulfill the condition specified above and only recopy the noises affecting the preceding elements ($Fo + \Delta$ and P). The characteristics feature of the arrangement described, which consists of using an auxiliary oscillator with a very short frequency variation range, thus enables firstly a very high-performance auxiliary oscillator to be used and secondly, to have it work with a noise in controlled mode substantially lower than its inherent noise. In order that the variation range of $F_A$ is as short as possible, it is arranged so that the fixed part of $F_A$ is situated approximately in the centre of the variation range of $F_S$. Having fixed the latter, namely at 1000 to 2000 MHz in the example in question, PQ is thus taken $=1500$. As the high output frequency step is finally P/r, if one desires, for example, to have large steps of 10 MHz, one will take $r=10$ and $P=100$, with $Q=15$.

From the preceding formulae, one can conclude, as regards the example in question: 20 to $30+10N=1000$ to 2000 in which $N=98$ to 197.

If the noise $BF_S$ is now examined, it will be seen that it includes a first term $BF_A \times N/Qr$ (equation 3) and a second term, essentially constituted by the contribution of the mixers $M_1$ and $CP_2$. This contribution is weak owing to the fact that the multiplication ratios $T_1$ and $T_2$ are low (this results from the known functioning of a mixer). Disregarding this, it can finally be seen that the output noise is only multiplied by the factor $N/Qr$, which varies from 0.653 to 1.313, in relation to that which affects $F_A$, in other words, that it differs from the noise which affects $F_A$ by between $-4$ and $+2.3$ decibels.

It will be noted that it will be possible to increase the number of mixers: in order to obtain, for example, steps of 1 MHz, it is sufficient to merely add a third mixer with a divider by 10, followed by a harmonics generator and which would moreover receive the beat derived from $CP_1$ so as to generate the control voltage of $O_2$.

The digital approach loop $D_4-D_5-D_6-CP_3$ could be replaced by an analogical approach device, for example in the case where $O_1$ would be of the YIG type. It ought to be made clear that an approach device must also be provided in the arrangement shown in FIG. 1, the second loop being only a frequency sustaining loop and not a frequency positioning loop.

The constitution of the first control loop which generates $F_A$ and $F_A/Q$ could itself contain variants.

By way of example, the divider $D_2$ could be connected between M and $CP_1$ and the standard frequency could be replaced by PQ, or one could even suppress $D_2$ completely and divide the harmonic Q of $Fo+\Delta$ by N in $D_1$.

It will be observed that the arrangement of FIG. 2 is deduced from the more general case of FIG. 1 by having $n=2$, $R_1=Q$ and $R_2=Qr$, in which $R=Qr$ and $N'=Qr+\Sigma_1^2 Si(Qr/Ri)$-
$Ti=Qr(1+S_1T_1/Q+S_2T_2/Qr)$
$N'=Qr+S_1T_1r+S_2T_2$.

From this, it follows that $N'=N$ and consequently $K_1'1$.

Thus $F_S=Q[NP/R+(Fo+\Delta).R]=(Fo+\Delta+NP)/r$.

What is claimed is:

1. A frequency synthesizer for generating an output frequency variable in a predetermined range by frequency steps having a predetermined value, said synthesizer comprising a first phase locked loop including a first current or voltage controlled oscillator, said first oscillator having a frequency control input and an ouput; a first phase comparator having first and second inputs and an output, the output of the first comparator being connected to the frequency control input of the first oscillator, source means providing an input frequency $(F_o+\Delta)$, $F_o$ being a fixed frequency and $\Delta$ being a frequency increment variable by predetermined steps which are small with respect to the steps of variation of the output frequency; first divider means connecting said source means to the first input of the first comparator, said first divider means having a first programmable division factor N which is adapted to take a first number of values equalling the number of steps of variation in said output frequency range; second divider means and first mixer means serially connected between the output of the first oscillator and the second input of the first comparator, said second divider means having a second predetermined factor of division Q and a source of standard frequency connected to the first mixer means, said frequency synthesizer further comprising a second phase locked loop including a second current or voltage controlled oscillator having a frequency control input and an output on which the output frequency of the synthesizer is generated, a second phase comparator having first and second inputs and an output, the output of the second phase comparator being connected to the frequency control input of the second oscillator; second mixer means having first and second inputs and an output, the first and second inputs of the second mixer means being respectively connected to the respective outputs of the first and second oscillators, and circuit means connecting the output of the second mixer means to the first input of the second phase comparator and the output of the first oscillator to the second input of the second phase comparator, said circuit means comprising a third frequency divider having a third predetermined division factor R, an input connected to the output of said first oscillator and output means connected to the second input of the second phase comparator, and means connecting the output of the second mixer means to the first input of the second phase comparator, the first and second factors N and Q and the standard frequency having such values that the output frequency $F_A$ of the first oscillator is located within the predetermined range of the output frequency.

2. A frequency synthesizer as claimed in claim 1, wherein the first division factor N has such values that the ratio $F_S/F_A$ of the output frequencies of the respective second and first oscillators does not substantially depart from unity within the output frequency range and the product of the second division factor Q by the standard frequency is of the same order of magnitude as the arithmetical mean of the lower and upper limits of said predetermined output frequency range.

3. A frequency synthesizer as claimed in claim 1, wherein said output means of the third frequency divider includes an harmonic generator.

4. A frequency synthesizer for generating an output frequency variable in a predetermined range by frequency steps having a predetermined value, said synthesizer comprising a first phase locked loop including a first current or voltage controlled oscillator, said first oscillator having a frequency control input and an output, a first phase comparator having first and second inputs and an output, the output of the first comparator being connected to the frequency control input of the first oscillator, source means providing an input frequency $(F_o+\Delta)$, $F_o$ being a fixed frequency and $\Delta$ being a frequency increment variable by predetermined steps which are small with respect to the steps of variation of the output frequency; first divider means connecting said source means to the first input of the first comparator, said first divider means having a first programmable division factor N which is adapted to take a first number of values equalling the number of steps of variation in said output frequency range; second divider means and first mixer means serially connected between the output of the first oscillator and the second input of the first comparator, said second divider means having a second predetermined factor of division Q and a source of standard frequency connected to the first mixer means, said frequency synthesizer further comprising a second phase locked loop including a second current or voltage controlled oscillator having a frequency control input and an output on which the output frequency of the synthesizer is generated, a second phase comparator having first and second inputs and an output, the output of the second phase comparator being connected to the frequency control input of the second oscillator; second mixer means having first and second inputs and an output, the first and second inputs of the second mixer means being respectively connected to the respective outputs of the first and second oscillators, and circuit means connecting the output of the second mixer means to the first input of the second phase comparator and the output of the first oscillator to the second input of the second phase comparator, said circuit means comprising a third frequency divider having a third predetermined division factor R, an input connected to the output of said first oscillator and output means connected to the second input of the second comparator, and means connecting the output of the second mixer means to the first input of the second comparator, the first and second factors N and Q and the standard frequency having such values that the output frequency $F_A$ of the first oscillator is located within the predetermined range of the output frequency, said output means of the third frequency divider comprising a first harmonic generator, said circuit means further comprising at least one further mixer means having a first input connected to the output of the second mixer means and an output connected to the first input of the second comparator, said further mixer means having a second input, at least one further divider having a further predetermined factor $R_1$ and an input connected to the output of the first oscillator and an output, and at least one further harmonic generator connecting the output of the further divider to the second input of the further mixer means.

5. A frequency synthesizer for generating an output frequency variable in a predetermined range by frequency steps having a predetermined value, said synthesizer comprising a first phase locked loop including a first current or voltage controlled oscillator, said first oscillator having a frequency control input and an output; a first phase comparator having first and second inputs and an output, the output of the first comparator being connected to the frequency control input of the first oscillator, source means providing an input frequency $(F_o+\Delta)/Q$, $F_o$ being a first frequency and $\Delta$ being a frequency increment variable by predetermined steps which are small with respect to the steps of variation of the output frequency and Q being a second predetermined factor; first divider means connecting said source means to a first input of the first comparator, said first divider means having a first programmable division factor N which is adapted to take a first number of values equalling the number of steps of variation in said output frequency range; first mixer means connected between the output of the first oscillator and the second input of the first comparator, and a source of standard frequency connected to the first mixer means, said frequency synthesizer further comprising a second phase locked loop including a second current or voltage controlled oscillator having a frequency control input and an output on which the output frequency of the synthesizer is generated, a second phase comparator having first and second inputs and an output, the output of the second phase comparator being connected to the frequency control input of the second oscillator; second mixer means having first and second inputs and an output, the first and second inputs of the second mixer means being respectively connected to the respective outputs of the first and second oscillators, and circuit means connecting the output of the second mixer means to the first input of the second phase comparator and the output of the first oscillator to the second input of the second phase comparator, said circuit means comprising a further frequency divider having a third predetermined division factor R, an input connected to the output of said first oscillator and output means connected to the second input of the second phase comparator, and means connecting the output of the second mixer means to the first input of the second phase comparator, the first and second factors N and Q and the standard frequency having such values that the output frequency $F_A$ of the first oscillator is located within the predetermined range of the output frequency.

6. A frequency synthesizer for generating an output frequency variable in a predetermined range by frequency steps having a predetermined value, said synthesizer comprising a first phase locked loop including a first current or voltage controlled oscillator, said first oscillator having a frequency control input and an output, a first phase comparator having first and second inputs and an output, the output of the first comparator being connected to the frequency control input of the first oscillator, source means providing an input frequency $(F_o+\Delta)$, $F_o$ being a fixed frequency and $\Delta$ being a frequency increment variable by predetermined steps which are small with respect to the steps of variation of the output frequency; first divider means connecting said source means to the first input of the first comparator, said first divider means having a first programmable division factor N which is adapted to take a first number of values equalling the number of steps of variation in said output frequency range; second divider means and first mixer means serially connected between the output of the first oscillator and the second input of the first comparator, said second divider means having an output and a second predetermined factor of division Q and a source of standard frequency connected to the first mixer means, said frequency synthesizer further comprising a second phase locked loop including a second current or voltage controlled oscillator having a frequency control input and an output on which the output frequency of the synthesizer is generated, a second phase comparator having first and second inputs and an output, the output of the second phase comparator being connected to the frequency control input of the second oscillator; second mixer means having first and second inputs and an output, the first and second inputs of the second mixer means being respectively connected to the respective outputs of the first and second oscillators, and circuit means connecting the output of the second mixer means to the first input of the second phase comparator and the output of the second divider means to the second input of the second phase comparator, said circuit means comprising a third frequency divider having a third predetermined division factor R, an input connected to the output of said second divider means and output means connected to the second input of the second comparator, and means connecting the output of the second mixer means to the first input of the second comparator, the first and second factors N and Q and the standard frequency having such values that the output frequency $F_A$ of the first oscillator is located within the predetermined range of the output frequency, said output means comprising at least one further mixer means having a first input connected to the output of the second mixer means and an output connected to the first input of the second comparator, said further mixer means having a second input and at least one harmonic generator connecting the output of the second divider means to the second input of the further mixer means.

7. A frequency synthesizer as claimed in claim 4, wherein said circuit means further comprise filter means serially interconnecting the respective second and further mixer means and the second comparator and wherein the algebraic sum $\Sigma$ of the quotients by the respective ranks of the harmonics generated by the respective first and further harmonic generators by the respective fixed division factors R and $R_1$ of the third and further divider means is so predetermined that the ratio $(1+\Sigma)/N$ is a constant proportional to the quotient of said predetermined value of the frequency step of the output frequency by the standard frequency.

* * * * *